(12) United States Patent
Aguirre et al.

(10) Patent No.: US 10,033,121 B2
(45) Date of Patent: Jul. 24, 2018

(54) FASTENER, SHIELD, AND CORRESPONDING SYSTEMS AND METHODS

(71) Applicant: ARRIS Enterprises, Inc., Suwanee, GA (US)

(72) Inventors: Sergio Alfredo Mendoza Aguirre, Escobedo (MX); Carlos Gonzalez Inda, Guadalupe (MX); Julio Cesar Ayala Vera, Apodaca (MX)

(73) Assignee: ARRIS Enterprises LLC, Suwanee, GA (US)

( * ) Notice: Subject to any disclaimer, the term of this patent is extended or adjusted under 35 U.S.C. 154(b) by 117 days.

(21) Appl. No.: 14/939,166

(22) Filed: Nov. 12, 2015

(65) Prior Publication Data

US 2017/0141555 A1 May 18, 2017

(51) Int. Cl.
| | |
|---|---|
| *H02G 3/14* | (2006.01) |
| *H01R 4/66* | (2006.01) |
| *F16B 5/02* | (2006.01) |
| *F16B 5/10* | (2006.01) |
| *F16B 21/04* | (2006.01) |
| *F16B 39/282* | (2006.01) |
| *H05K 5/02* | (2006.01) |
| *H05K 9/00* | (2006.01) |

(52) U.S. Cl.
CPC ............... *H01R 4/66* (2013.01); *F16B 5/02* (2013.01); *F16B 5/10* (2013.01); *F16B 21/04* (2013.01); *F16B 39/282* (2013.01); *H05K 5/0221* (2013.01); *H05K 9/006* (2013.01)

(58) Field of Classification Search
CPC ...................................................... H02G 3/14
USPC ............................................................ 174/562
See application file for complete search history.

(56) References Cited

U.S. PATENT DOCUMENTS

| | | | | |
|---|---|---|---|---|
| 3,048,747 | A | * 8/1962 | Errichiello | ........... H05K 7/1412 174/535 |
| 3,123,389 | A | * 3/1964 | Biesecker | ................. F16B 5/10 292/218 |
| 4,201,111 | A | 5/1980 | Kuttler | |
| 4,657,462 | A | 4/1987 | Hoen | |
| 5,170,321 | A | 12/1992 | Oslund et al. | |
| 5,354,951 | A | 10/1994 | Lange, Sr. et al. | |
| 5,361,952 | A | 11/1994 | Gold | |
| 5,368,427 | A | * 11/1994 | Pfaffinger | ............... F16B 21/04 24/580.1 |

(Continued)

*Primary Examiner* — Hoa C Nguyen
*Assistant Examiner* — Stanley Tso
(74) *Attorney, Agent, or Firm* — Lori Anne D. Swanson

(57) ABSTRACT

A system (100) includes a threaded boss (101) defining a central axis (104), a metal panel (102), and a fastener (103) to couple the metal panel to the threaded boss. The fastener includes a threaded shaft (105) terminating at a paddle (106), which can be oblong. The metal panel can define an oblong aperture (112), where the paddle is to pass through the oblong aperture when rotated (115) to a first rotational alignment (113) about the central axis. The metal panel can also include one or more retention contours (116,117) disposed adjacent to the oblong aperture. Each retention contour can include a ramp (118,120) defined by a curved central axis (305) and a retention bridge (119,121) defining a recess (122,123) to receive the oblong paddle when rotated to a second rotational alignment (114) about the central axis.

20 Claims, 10 Drawing Sheets

(56) References Cited

U.S. PATENT DOCUMENTS

| | | | |
|---|---|---|---|
| 5,453,027 A * | 9/1995 | Buell | H01R 4/64 |
| | | | 439/426 |
| 5,557,063 A | 9/1996 | Mottahed | |
| 5,614,694 A | 3/1997 | Gorenz et al. | |
| 5,947,191 A | 9/1999 | Hiteshew et al. | |
| 7,607,553 B2 | 10/2009 | Weber | |
| 2014/0263298 A1 | 9/2014 | Jones et al. | |

* cited by examiner

FASTENER, SHIELD, AND CORRESPONDING SYSTEMS AND METHODS

BACKGROUND

Technical Field

This disclosure relates generally to fasteners, and more particularly to rotational fasteners.

Background Art

Fasteners, such as screws, nails, staples, and so forth, are used in a wide variety of applications to couple items together. For example, a nail may be used to join two pieces of wood together. Similarly, a screw may be used to couple to pieces of metal together.

Fasteners are frequently used in electronic applications to couple housing portions together. Illustrating by way of example, a screw may be used to fasten a cover to a terminal box or a junction box. Similarly, screws may be used to couple components together within a housing. Fans, circuit boards, or other components may be coupled to the housing by fasteners so that they do not move when active.

In a cable television amplifier application, fasteners may be used to couple electronic shields around circuitry. For instance, amplifiers used to distribute radio-frequency video, data, or telephony signals employ large currents to apply gain to these signals. Such amplifiers can emit a large amount of electromagnetic noise. Frequently shielding is required, with the shield tied to electrical ground, so that this electromagnetic noise does not affect the operation of other electronic components.

Presently, Phillips head screws are used to couple shielding metal to components of a chassis that are coupled to electrical ground. For optimal shielding, the shielding metal needs to be coupled to electrical ground at several locations. Accordingly, in some applications as many as twelve or more screws are required to couple a single metal shield to the device housing.

The use of so many screws is problematic. Illustrating by example, when a field technician is working on an amplifier module, they much remove each and every screw to make link configurations and adjustments. When they test the circuitry, each and every screw must be replaced for proper grounding. When making diagnostic repairs, such as alignment and testing of the amplifier, a technician may remove and replace each and every screw several times, which is tedious, time consuming, and costly.

It would be advantageous to have an improved fastener for use in electronic and other applications.

Figure 1:
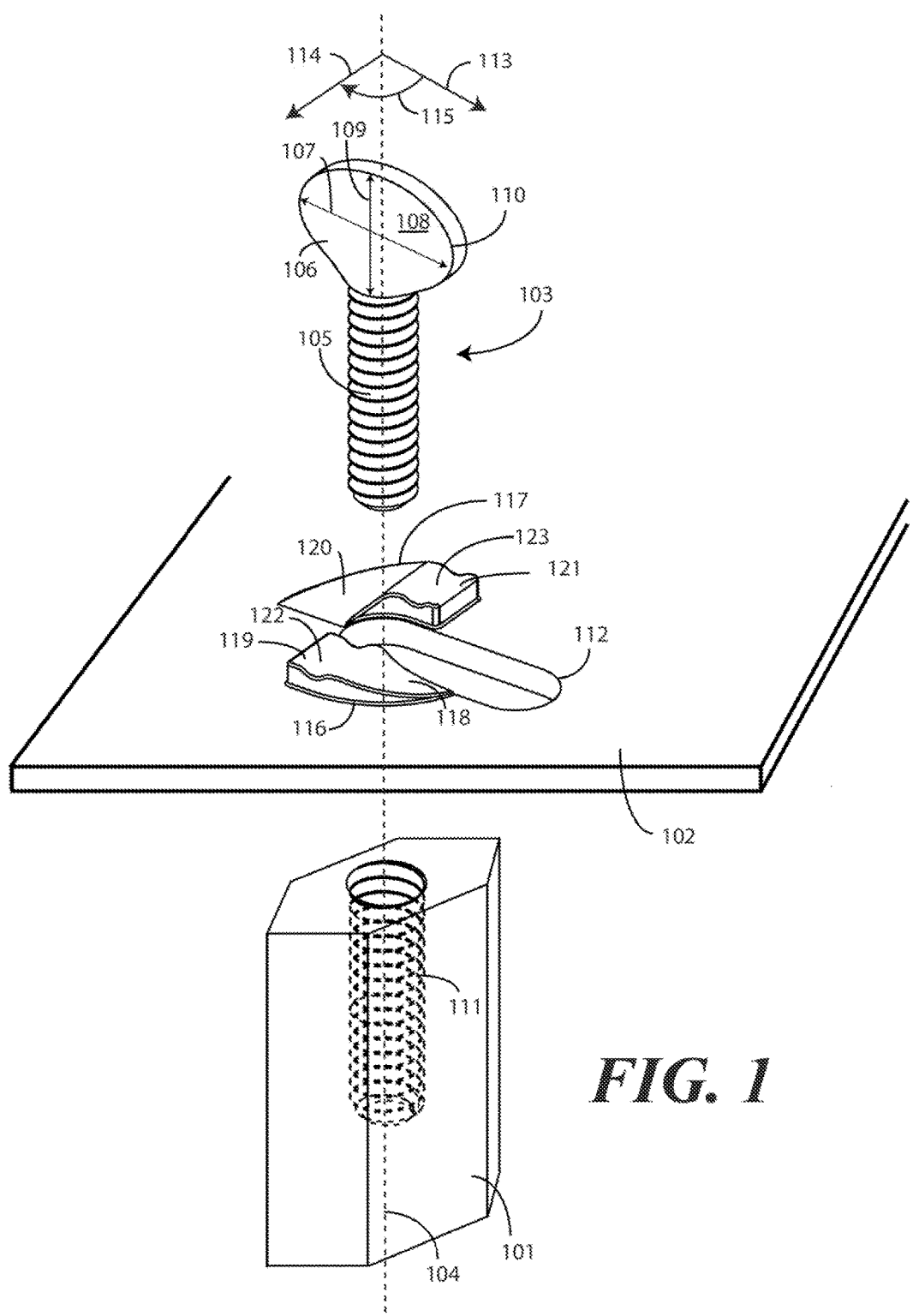
FIG. 1 illustrates an exploded perspective view of one explanatory system in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide a system that includes a metal cover, a threaded boss, and a fastener. In one embodiment, the threaded boss defines a central axis. In one embodiment, the fastener couples the metal plate to the threaded boss when a threaded shaft terminating at an oblong paddle is rotationally inserted into the threaded boss.

In one embodiment, the metal panel defines an oblong aperture having a major dimension defined along a first axis and a minor dimension defined along a second axis. When assembling the system, the oblong paddle to able pass through the oblong aperture when the paddle is rotated to a first rotational alignment about the central axis. In one embodiment, the metal panel also includes one or more retention contours disposed adjacent to the oblong aperture. In one embodiment, each retention contour includes a curved ramp having a median axis defined by a radius rotated about a focus such that the median axis is curved and centrally disposed along the ramp. In one embodiment, each ramp extends to a retention bridge defining a recess to receive the oblong paddle when it rotated to a second rotational alignment about the central axis. The recess is configured to retain the oblong paddle in the second rotational alignment to retain the metal panel in electrical contact with the threaded boss.

In one embodiment, the oblong aperture and the one or more retention devices are formed by a metal punching and stamping process. Accordingly, a legacy shield can be stamped and pressed to facilitate use of the system without manufacturing a new metal panel. In one embodiment, the metal panel is punched by metal stamping in the locations where a prior art Phillips head screw would reside. The punching process creates each retention device in addition to the oblong aperture. In one embodiment each retention device is defined by a progressive protrusion that serves as a quick fastening, quarter-turn fastening mechanism for the oblong paddle of the fastener.

During attachment of the metal panel to the threaded boss, the metal panel is placed and the fasteners are rotationally inserted into the threaded boss. The fasteners can then be tightened to a certain torque limit, with the rotational insertion terminating when the oblong paddle is disposed at a first rotational alignment about the central axis of the threaded boss. The amount of threaded insertion will define the torque and fastening force of the fastener in one or more embodiments. Said differently, in one embodiment lateral force against the metal panel can be increased with each rotation of the fastener.

At this point, the metal panel can be positioned atop the threaded boss, with the oblong paddle passing through the oblong aperture when oriented in the first rotational alignment about the central axis. The metal panel is then physically and electrically coupled to the threaded boss by rotating the oblong paddle of the fastener to a second rotational alignment about the central axis. This rotation causes the oblong paddle to translate along the curved ramp, thereby deflecting the metal panel in one embodiment. The rotation ceases when the oblong paddle is in the second rotational alignment in which it seats within a rounded, concave contour of the retention bridge. In one embodiment the first rotational alignment is orthogonal with the second rotational alignment. Said differently, in one embodiment a rotation of one-quarter turn causes the oblong paddle to rotate from the first rotational alignment to the second rotational alignment.

When the metal panel is removed, the fastener does not need to be removed completely. To the contrary, in one embodiment the fastener only needs to be rotated by one-quarter turn where a major axis of the oblong paddle is aligned with a major axis of the oblong aperture. This allows the metal panel to be removed by passing the oblong paddle through the oblong aperture.

In one or more embodiments, the metal panel comprises a radio frequency shield that is coupled to an electrical ground node by coupling the metal panel to the threaded boss. Advantageously, since the fastener does not need to be completely removed from the threaded boss, the fastener is therefore captive within the threaded boss. This reduces the occurrence of failure due to misplacing or losing conventional screws. Additionally, embodiments of the disclosure advantageously prevent loose screws from falling into electrical circuit compartments, which can cause circuit failures, shorts, and other problems. Embodiments of the disclosure differ from prior art solutions in that the prior art fails to teach a quick release mechanism for a metal panel. Nor do prior art solutions teach fasteners that are captive within threaded bosses.

In one embodiment, a system in accordance with one or more embodiments of the disclosure provides a captive, quick release, quarter turn fastener to secure a metal panel to a housing for radio frequency electromagnetic noise shielding. In one embodiment, the fastener is retained in a locked position, i.e., in the second rotational alignment, by one or more raised, ramped, indented features formed in the metal panel. Such embodiments are distinguished from the prior art in that no prior art solution provides a quick release, quarter turn fastener used to secure a radio frequency shield to a device housing or threaded boss. Advantageously, embodiments of the disclosure save significant radio frequency amplifier shield assembly and/or disassembly time.

Turning now to FIG. 1, illustrated therein is one embodiment of a system 100 in accordance with one or more embodiments of the disclosure. Generally, the components of the system 100 include a threaded boss 101, a metal panel 102, and a fastener 103. The threaded boss 101 could be coupled to other devices. For example, as will be shown in more detail below, in one embodiment the threaded boss 101 extends distally from a housing of a radio frequency amplifier trunk. The threaded boss 101 could be coupled to other devices as well, including chassis, device housings, other components, and so forth. Other things to which the threaded boss 101 could be coupled will be obvious to those of ordinary skill in the art having the benefit of this disclosure.

In one embodiment, the fastener 103 is to couple the metal panel 102 to the threaded boss 101. In one embodiment, this coupling is both a physical coupling and an electrical coupling. For example, in one embodiment both the threaded boss 101 and the metal panel 102 are manufactured from an electrically conductive metal. Where, for example, the threaded boss 101 is coupled to an electrical ground of a housing, casing, or other surround, the fastener 103 can be used to electrically couple the metal panel 102 to electrical ground by coupling the metal panel 102 to the threaded boss 101. Thus, the fastener 103 can ground the metal panel 102 so that it can be used as an electromagnetic shield. In one embodiment, as will be shown below with reference to FIG. 13, the fastener can be used to couple the metal panel 102 to a threaded boss 101 extending from a cable television radio frequency amplifier so that the metal panel 102 can be used as a radio frequency shield. Other applications will be obvious to those of ordinary skill in the art having the benefit of this disclosure.

In one embodiment, the fastener 103 comprises a threaded shaft 105 and a paddle 106. In one embodiment, the threaded shaft 105 terminates at the paddle 106. In one embodiment, the threaded shaft 105 and the paddle 106 are manufactured from a unitary piece of electrically conductive metal. In another embodiment, the paddle 106 is coupled to the threaded shaft by a welding process or other coupling process.

In one embodiment, the paddle 106 is an oblong paddle in that it has a major dimension 107 along a major face 108 that is greater than its minor dimension 109 along the major face 108. In the illustrative example of FIG. 1, the major dimension 107 is the width of the major face 108, while the minor dimension 109 is the height. In other embodiments, the major dimension 107 is the height and the minor dimension 109 is the width.

In the illustrative embodiment of FIG. 1, the major face 108 is rounded. Said differently, in this illustrative embodiment the major face 108 has an ovular perimeter 110 and defines an ovular major face. However, embodiments of the disclosure are not so limited. In other embodiments the major face 108 can comprise one or more corners so as to be rectangular, hexagonal, pentagonal, and so forth. Still other configurations will be obvious to those of ordinary skill in the art.

In one embodiment, the threaded boss 101 defines a central axis 104 that passes axially through a threaded aperture 111 of the threaded boss 101. In one embodiment, the fastener 103 is to couple to the threaded boss 101 when rotationally inserted into the threaded aperture 111 along the central axis 104.

In one embodiment, the metal panel 102 defines an oblong aperture 112. The oblong aperture 112 can be cut into the metal panel 102 by a punch process. In one or more embodiments, the oblong aperture 112 can be cut into the metal panel 102 at a location where a former screw hole may have been. For example, if the metal panel 102 was a prior art panel with circular screw holes, it could be altered by a punch process that cuts the oblong aperture 112 at a location that circumscribes the prior screw hole. In other embodiments, such as where the metal panel 102 is initially a continuous metal sheet, the oblong aperture 112 can be cut at a location that corresponds to the threaded boss 101.

Figure 3:
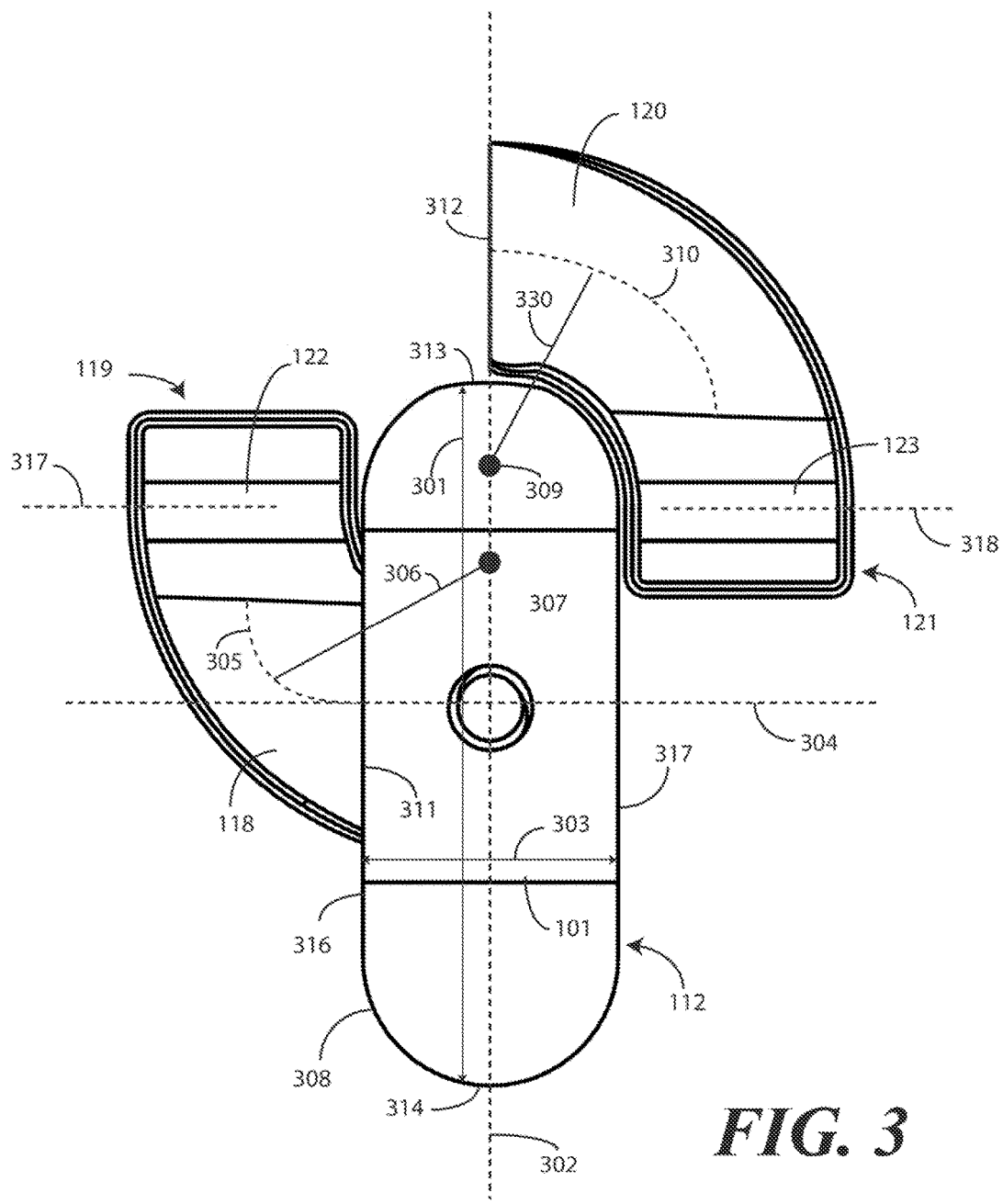
FIG. 3 illustrates an engaged top plan view of a metal panel and threaded boss in accordance with one embodiment of the disclosure.

Turning briefly to FIG. 3, illustrated therein is the oblong aperture 112 in plan view. In one embodiment the oblong aperture 112 has a major dimension 301 defined along a first axis 302 and a minor dimension 303 defined along a second axis 304. The major dimension 301 is greater than the minor dimension 303. While the major dimension 301 is defined along the first axis 302, and the minor dimension 303 is defined along a second axis 304 in the illustrative embodiment of FIG. 3, the convention could be reversed. Said differently, in other embodiments the major dimension 301 can be defined along the second axis 304 while the minor dimension 303 is defined along the first axis 302. Additionally, the first axis 302 and the second axis 304 can be rotated by various amounts from the north-south-east-west orientation illustrated in FIG. 3.

In this illustrative embodiment, the oblong aperture 112 is defined by a first semicircle 313 separated from a second semicircle 314 by a first extended edge 316 and a second extended edge 317. However, the oblong aperture 112 can be configured in other ways as well. The first semicircle 313 and second semicircle 314 could be semi-ovular, partially rectangular, partially hexagonal, or take other shapes depending upon the design of the paddle (106). Similarly, while the first extended edge 316 and the second extended edge 317 are straight in this embodiment, they could be convex or concave as well. Still other configurations will be obvious to those of ordinary skill in the art having the benefit of this disclosure.

Turning back to FIG. 1, major dimension (301) and minor dimension (303) of the oblong aperture 112 allow the paddle 106 to pass through the oblong aperture 112 under certain conditions. As noted above, in one embodiment the fastener 103 can be rotationally inserted into the threaded aperture 111 along the central axis 104 to couple to the threaded boss 101. During this insertion, the paddle 106 can be rotated fully three hundred and sixty degrees, with the major dimension 107 of the paddle 106 passing between a first rotational alignment 113 and a second rotational alignment 114. In this illustrative embodiment, the first rotational alignment 113 and the second rotational alignment 114 are substantially orthogonal with each other. As used herein, "substantially" means an orientation, alignment, or measurement inclusive of manufacturing tolerances. When the paddle 106 is in the first rotational alignment, the major dimension 107 of the paddle 106 aligns with the major dimension (301) of the oblong aperture 112. Accordingly, the paddle 106 can pass through the oblong aperture 112 when rotated to this first rotational alignment 113 about the central axis 104.

This ability of the paddle 106 to pass through the oblong aperture 112 advantageously allows a technician to fully insert the fastener 103 into the threaded boss 101 before the metal panel 102 is placed against the threaded boss 101, stopping the insertion when the paddle 106 is rotated 115 to the first rotational alignment 113 about the central axis 104. A technician can then place the metal panel 102 against the top of the threaded boss 101 by passing the oblong aperture 112 about the paddle. As will be described in more detail below, a user can then rotate 115 the paddle 106 to a second rotational alignment 114 to couple the metal panel 102 to the threaded boss 101.

In one embodiment, the metal panel 102 also includes one or more retention contours 116,117. In this illustrative embodiment, the metal panel 102 includes two retention contours 116,117, with each being disposed adjacent to the oblong aperture 112.

In one embodiment, each retention contour 116,117 can be formed in the metal panel 102 by a pressing or stamping operation. Where so manufactured, each retention contour 116,117 would comprise a stamped metal contour or, alternatively, a pressed metal contour. In one embodiment, the pressing or stamping operation can be combined with the punching operation such that the oblong aperture 112 and the two retention contours 116,117 are formed at the same time. If, for example, the metal panel 102 was a prior art panel with circular screw holes, it could be altered by a combination punch and press and/or stamp operation that both cuts the oblong aperture 112 and forms the retention contours 116,117, each occurring at or about a location that circumscribes the prior screw hole. In other embodiments, the retention contours 116,117 can be attached to the top surface of the metal panel 102. In other embodiments, such as where the metal panel 102 is initially a continuous metal sheet, the oblong aperture 112 and retention contours 116, 117 can be created—either in one operation or multiple operations—at a location that corresponds to the threaded boss 101.

In one embodiment, each retention contour 116,117 comprises a ramp 118 and a retention bridge 119. In the illustrative embodiment of FIG. 1, retention contour 116 comprises ramp 118 and retention bridge 119, while retention contour 117 comprises ramp 120 and retention bridge 121. Turning briefly again to FIG. 3, in one embodiment each ramp 118 is defined by a curved central axis 305. In one or more embodiments, the curved central axis 305 is defined by a radius 306 having a focus 307 disposed within a perimeter 308 of the oblong aperture 112. In this illustrative embodiment, the curved central axis 305 is defined by radius 306 having an arc of forty-five degrees. Additionally, both the focus 307 of curved central axis 305 of ramp 118 and the focus 309 of curved axis 310 of ramp 120 are both disposed within the perimeter 308 of the oblong aperture 112. However, in this illustrative embodiment the second radius 330 originates at a second focus 309 offset along the first axis 302 from the focus 307 of radius 306. In other embodiments, the second focus 309 and the first focus 307 can be the same focus.

In one embodiment, each ramp 118,120 commences at a ramp lip 311,312. For example, in the illustrative embodiment of FIG. 3, ramp 118 commences at a first ramp lip 311, while ramp 120 commences at a second ramp lip 312. In this embodiment, the first ramp lip 311 is disposed adjacent to the first semicircle 313. In this embodiment, the second ramp lip 312 disposed adjacent to one extended edge 316 of the oblong aperture 112. In the illustrative embodiment of FIG. 3, each ramp lip 311,312 is oriented substantially parallel with the first axis 302 along which the major dimension 301 is oriented. Moreover, in this illustrative embodiment the ramp lip 312 of ramp 120 is collinear with the first axis 302, while the second axis 304 bisects the ramp lip 311 of ramp 118. Embodiments of the disclosure are not so limited however, as other alignments of each ramp lip 311,312 will be obvious to those of ordinary skill in the art having the benefit of this disclosure.

Referring now to both FIG. 1 and FIG. 3, in one embodiment each retention bridge 119,121 defines a recess 122,123 to receive the paddle 106 when rotated 115 to the second rotational alignment 114. In one embodiment, as best seen in FIG. 1, each recess 122,123 defines a concave, rounded contour in each retention bridge 119,121. However, each recess 122,123 could take other shapes, including having corners. In one embodiment, as best seen in FIG. 3, each recess 122,123 defines a median axis 317,318. In this illustrative embodiment, median axis 317 and median axis 318 are the same axis. In other embodiments, they may be different. In this illustrative embodiment each median axis 317,318 is oriented substantially parallel with the second axis 304 of the oblong aperture 112.

Recall from above that a technician can fully insert the fastener 103 into the threaded boss 101 before the metal panel 102 is placed against the threaded boss 101. The technician merely stops the insertion when the paddle 106 is rotated 115 to the first rotational alignment 113 about the central axis 104. The metal panel 102 can then be placed against the top of the threaded boss 101 by passing the oblong aperture 112 about the paddle 106.

Once this occurs, the technician can then rotate 115 the paddle 106 to the second rotational alignment 114 about the central axis 104. This causes the bottom edges of the paddle 106 to translate up each ramp 118,120 to each retention bridge 119,121. The metal panel 102 deflects slightly until the bottom edges of the paddle 106 seat within each recess 122,123, thereby securely coupling the metal panel 102 to the threaded boss 101. To remove the metal panel 102, such as when servicing circuitry disposed below the metal panel 102, a technician merely needs to turn the paddle 106 a quarter turn, i.e., rotate 115 the paddle 106 from the second rotational alignment 114 to the first rotational alignment 113, and then lift the metal panel 102 up by passing the paddle 106 through the oblong aperture 112. Advantageously, this process represents a significant timesavings over prior art designs where a technician had to remove ten or twelve screws completely with a screwdriver. Also advantageously, this process allows the metal panel 102 to be removed while the fastener 103 remains captive within the threaded boss 101. This prevents the fastener 103 from being lost or worse, dropped into electrical circuits, thereby causing failures.

Figure 2:
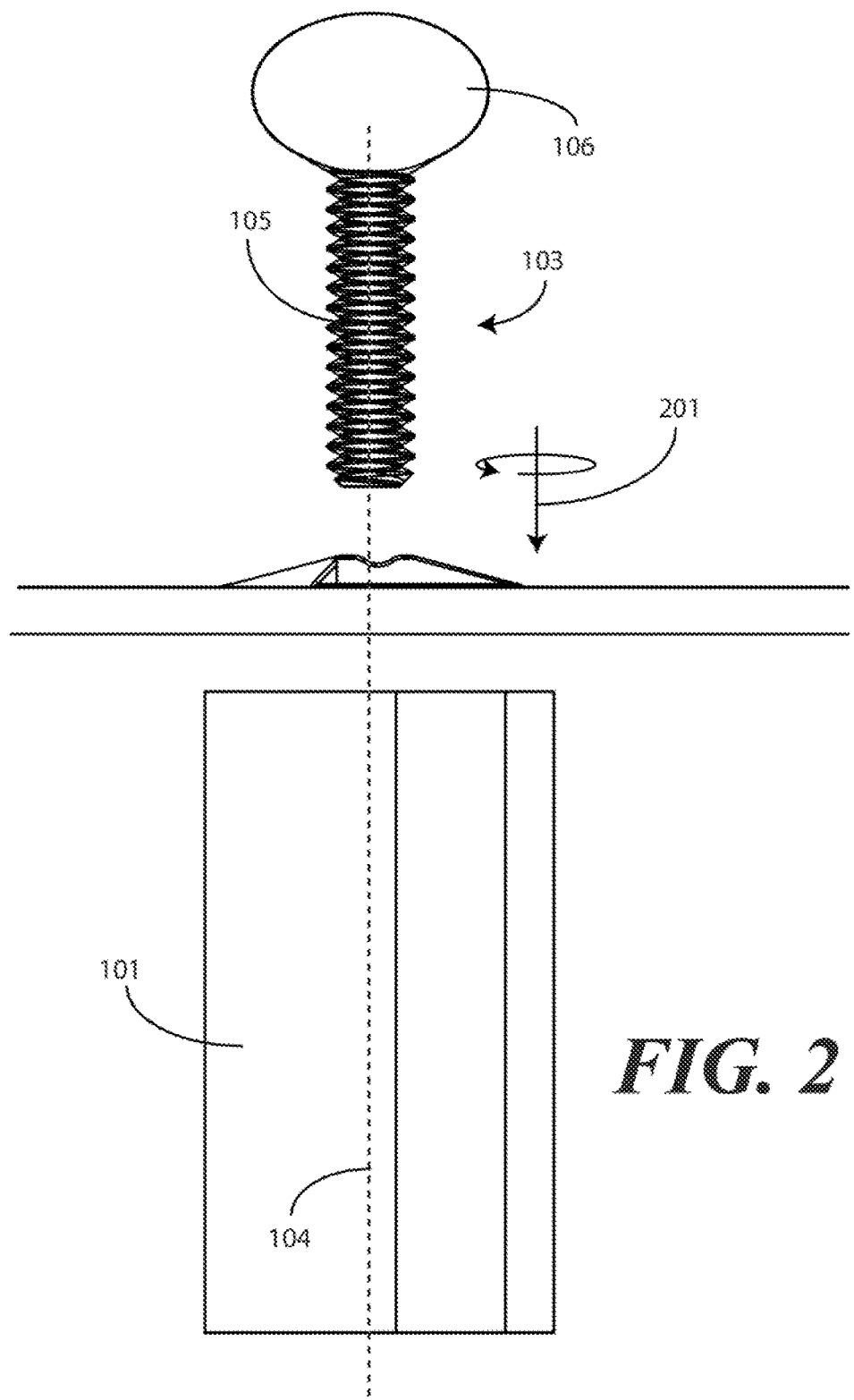
FIG. 2 illustrates an exploded side elevation view one explanatory system in accordance with one or more embodiments of the disclosure.

Now that the various components have been described, subsequent figures will illustrate assembly and disassembly of a system 100 in accordance with one or more embodiments of the disclosure. Beginning with FIG. 2, the fastener 103 is first aligned with the central axis 104 of the threaded boss 101. The fastener 103 can then be rotationally inserted 201 into the threaded boss 101. In one embodiment, the fastener 103 can be rotationally inserted 201 into the threaded boss 101 with the threaded shaft 105 tightened up to a certain limit into the threaded aperture (111) of the threaded boss 101. The amount of rotational insertion 201 into the threaded boss 101 will define the torque and fastening force of the fastener 103 in one or more embodiments. To ensure that the metal panel (102) can pass about the paddle 106 of the fastener 103, in one embodiment the rotational insertion 201 should terminate when the paddle 106 is rotated (115) to the first rotational alignment (113).

Figure 4:
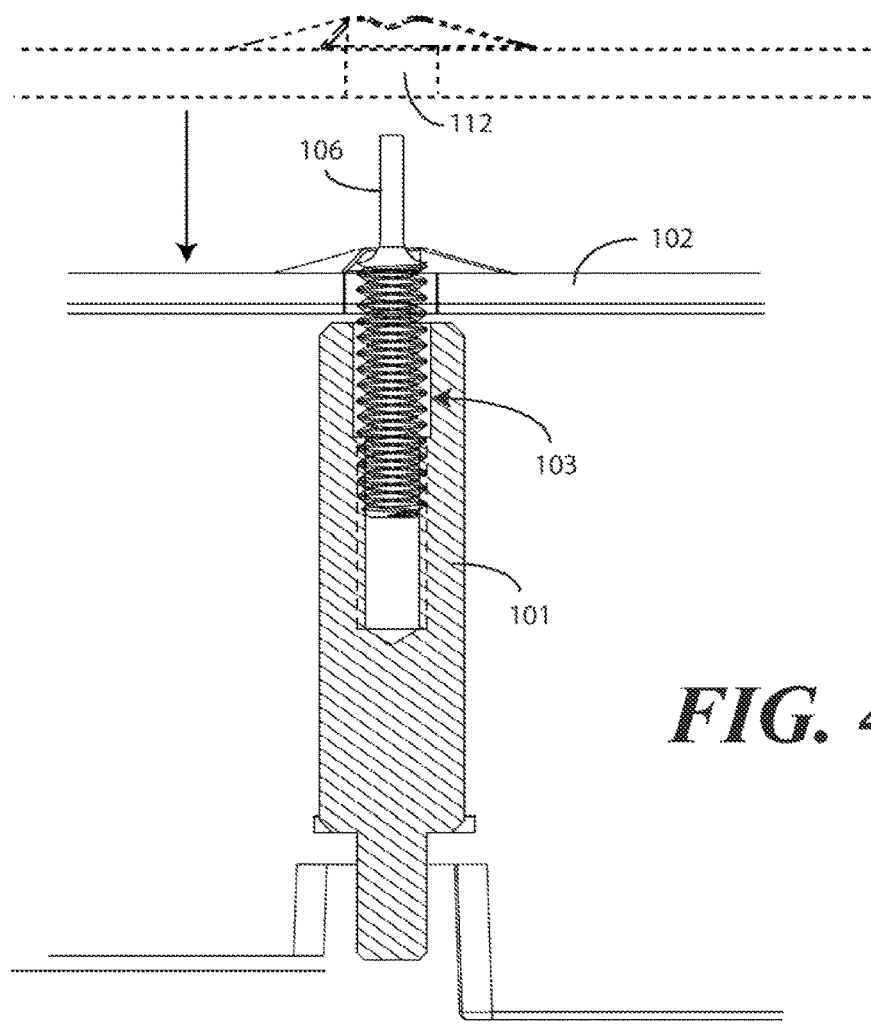
FIG. 4 illustrates an engaged sectional side elevation view of one explanatory system in accordance with one or more embodiments of the disclosure with a fastener oriented in a first rotational alignment and a metal panel in a first position.
Figure 5:
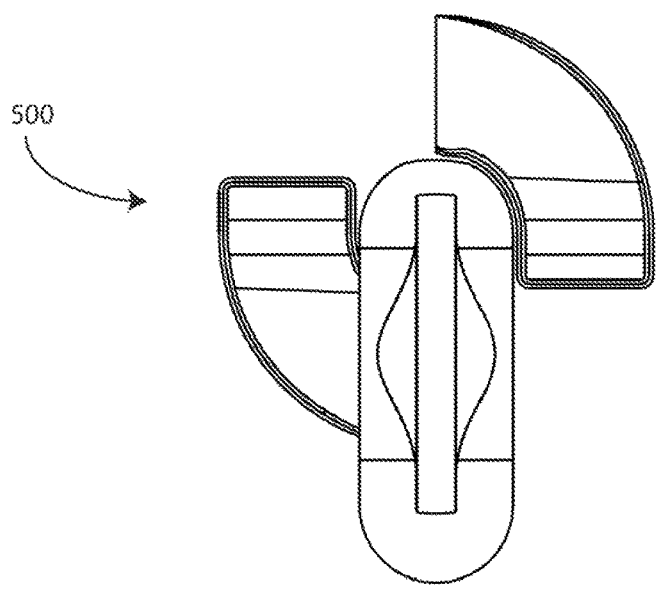
FIG. 5 illustrates a top plan view of FIG. 4.

Turning now to FIG. 4, the fastener 103 has been inserted into the threaded boss 101 and the paddle 106 is in the first rotational alignment (113). The metal panel 102 can now be placed against the threaded boss 101 by passing the oblong aperture 112 about the paddle 106. The resulting configuration 500 is shown in FIG. 5.

Figure 6:
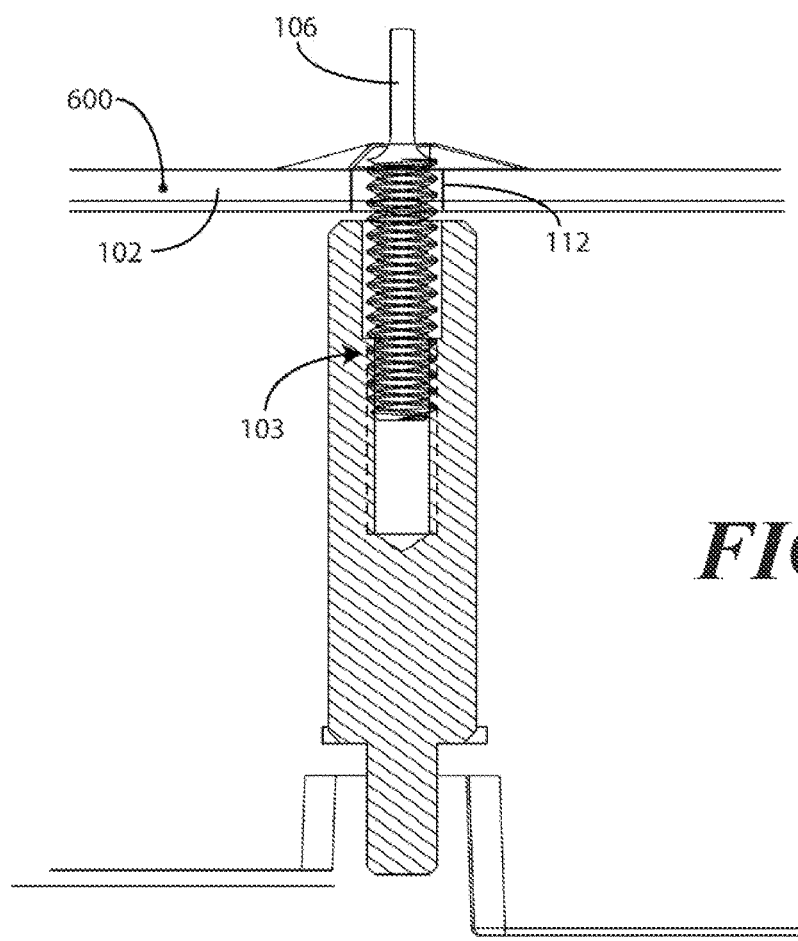
FIG. 6 illustrates an engaged sectional side elevation view of one explanatory system in accordance with one or more embodiments of the disclosure with a fastener oriented in a first rotational alignment and a metal panel in a second position.
Figure 7:
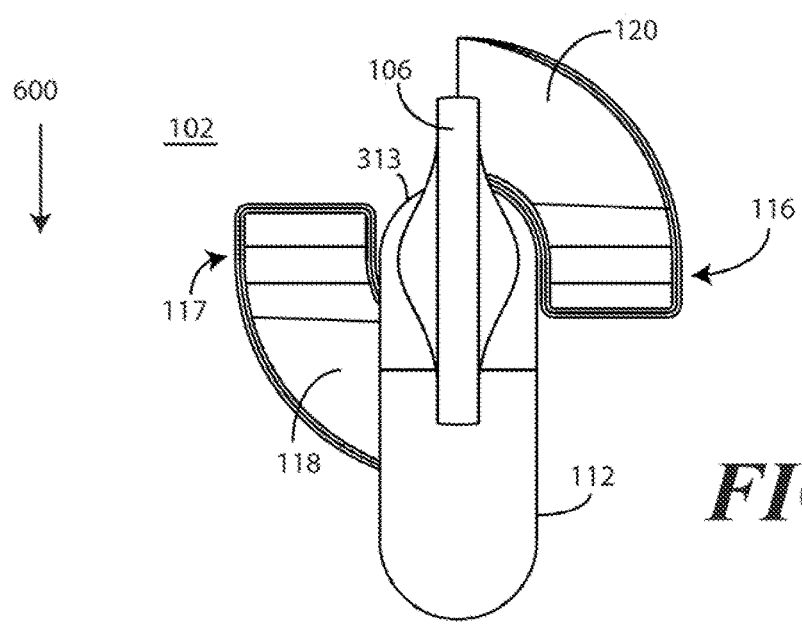
FIG. 7 illustrates a top plan view of FIG. 6.

Turning now to FIGS. 6 and 7, in one or more embodiments the next step will be translating 600 the metal panel 102 along the first axis (302) of the oblong aperture 112 to position the paddle 106 of the fastener 103 toward the semicircle 313 of the oblong aperture adjacent to which the retention contours 116,117 are disposed. In FIG. 6, this translation 600 would be outwardly from the page, while in FIG. 7 the translation 600 would be downward. This translation 600 disposes the paddle 106 adjacent to the retention contours 116,117 so that the bottom surfaces of the paddle 106 can translate along the ramps 118,120 when the paddle 106 is rotated (115) from the first rotational alignment (113) to the second rotational alignment (114), as shown in FIGS. 8-9.

Figure 8:
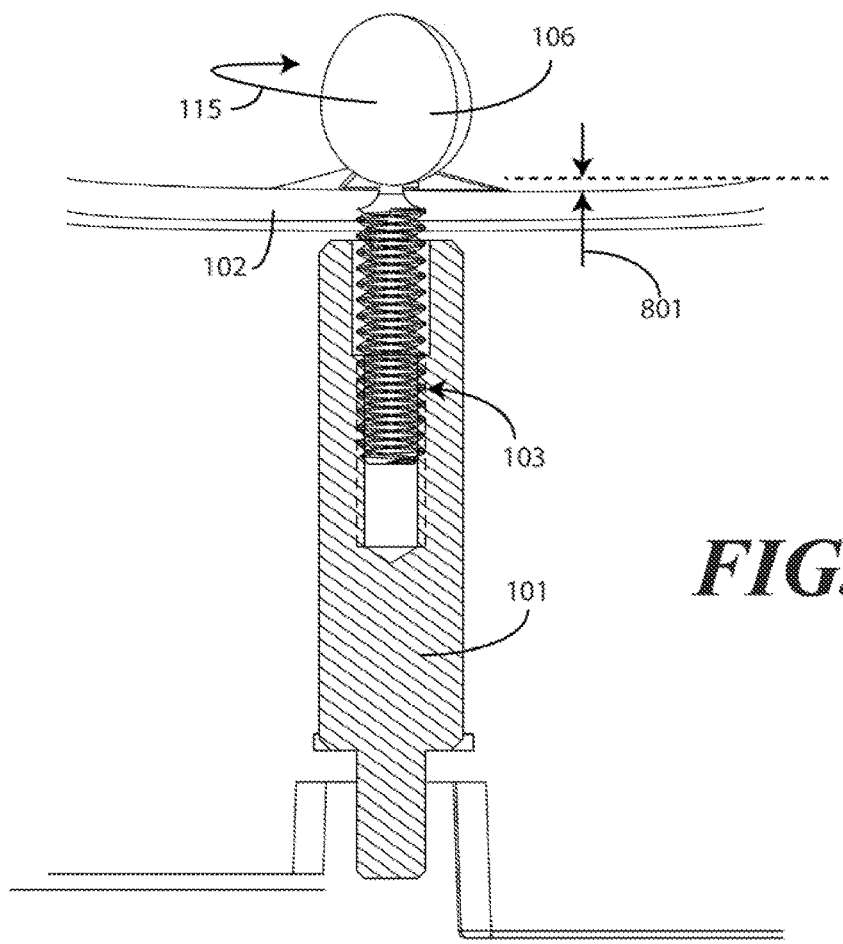
FIG. 8 illustrates an engaged sectional side elevation view of one explanatory system in accordance with one or more embodiments of the disclosure with a fastener oriented in a second rotational alignment and a metal panel in a second position.
Figure 9:
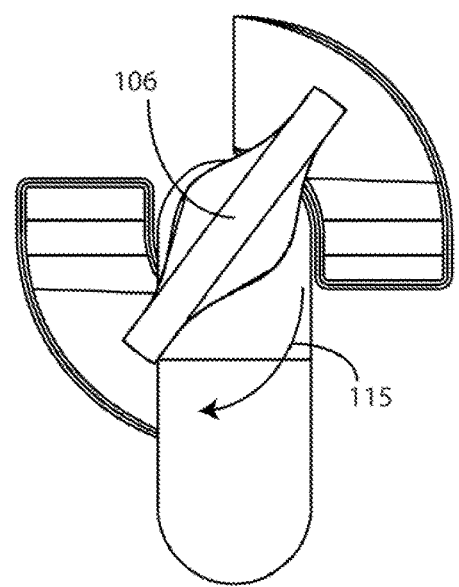
FIG. 9 illustrates a top plan view of FIG. 8.

Turning now to FIGS. 8 and 9, the paddle 106 is being rotated 115 between the first rotational alignment (113) to the second rotational alignment (114). As shown, the bottom surfaces of the paddle 106 translate along the ramps 118, 120. As the fastener 103 is captive within the threaded boss 101, this translation along the ramps 118,120 by the paddle 106 causes the metal panel 102 to deflect 801 in one or more embodiments. In one embodiment, the amount of deflection 801 will be determined by how far the fastener 103 was rotationally inserted (201) into the threaded boss 101 at FIG. 2.

Figure 10:
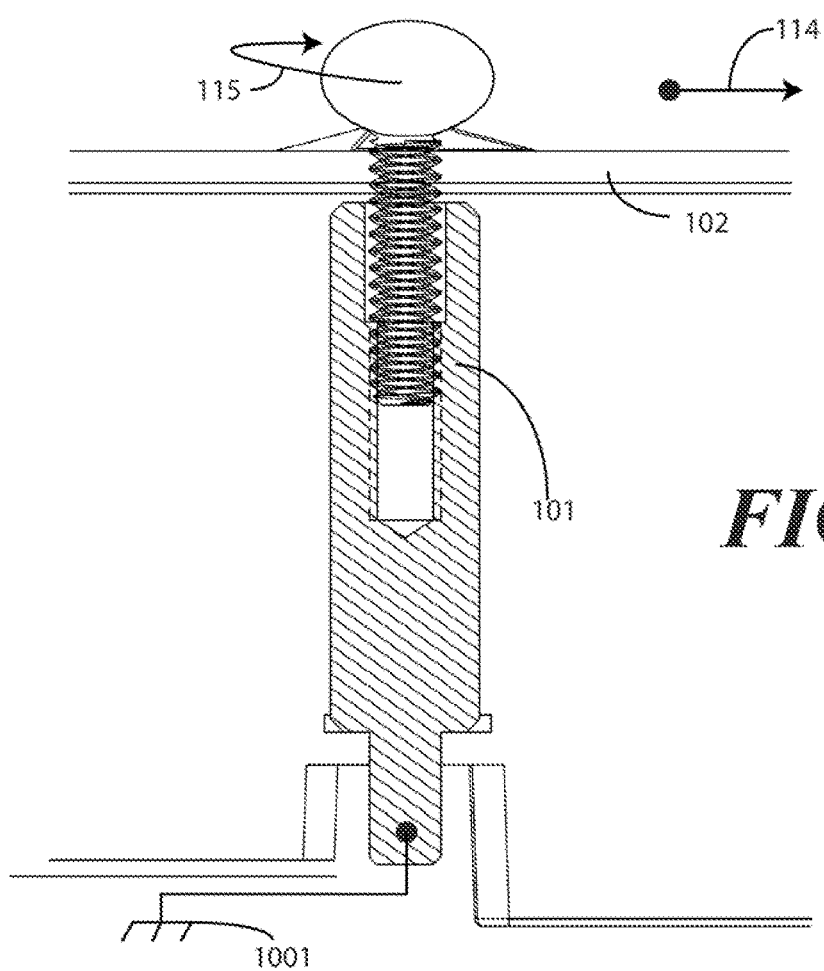
FIG. 10 illustrates an engaged sectional side elevation view of one explanatory system in accordance with one or more embodiments of the disclosure with a fastener oriented in a third rotational alignment and a metal panel in a second position.
Figure 11:
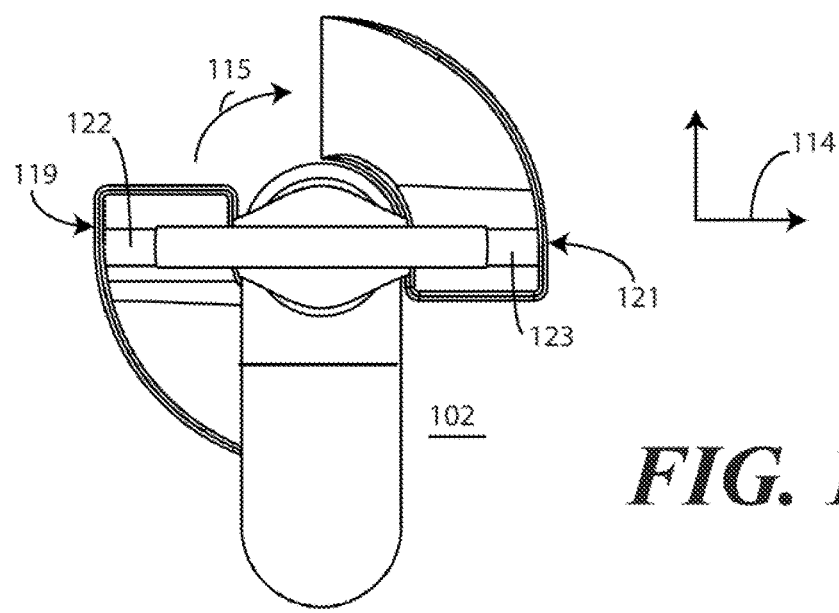
FIG. 11 illustrates a top plan view of FIG. 10.

Turning now to FIGS. 10 and 11, the paddle 106 has been fully rotated 115 between the first rotational alignment (113) to the second rotational alignment 114. As shown, the bottom surfaces of the paddle 106 are now seated within the recess 122,123 of each retention bridge 119,121. In effect, each recess 122,123 retains the paddle 106 in the second rotational alignment 114 and couples the metal panel 102 to the threaded boss 101. In one embodiment, the connection between the metal panel 102 and the threaded boss 101 is both a physical connection and an electrical connection. Where, for example, the threaded boss 101 is tied to an electrical ground node 1001, the electrical connection between the metal panel 102 and the threaded boss 101 allows the metal panel 102 to be used as a shield. In one embodiment, the metal panel 102 can be used as a radio frequency shield. To remove the metal panel 102, a technician simply executes the method steps in FIGS. 4-11 in reverse order.

Figure 12:
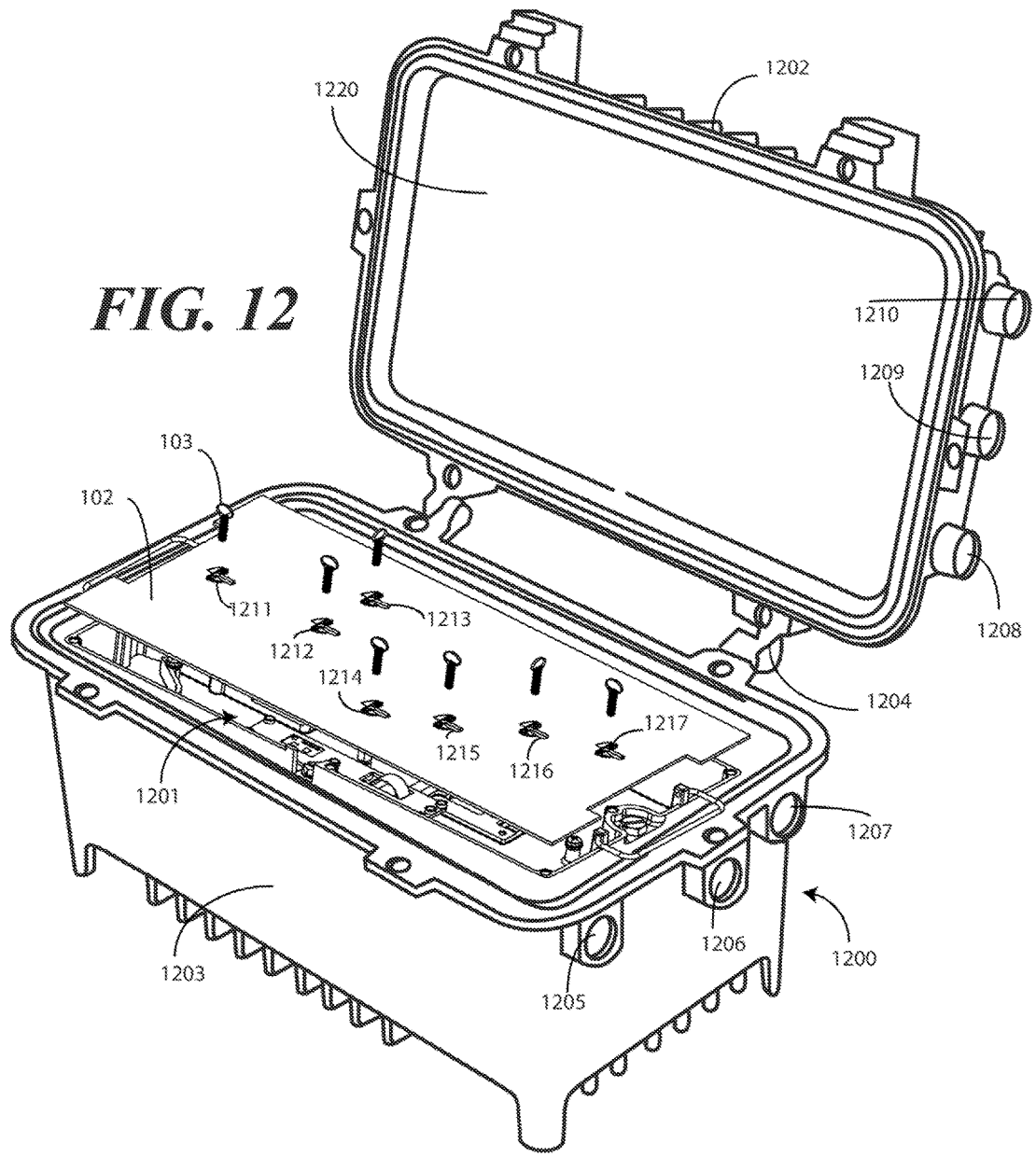
FIG. 12 illustrates an exploded perspective view of one explanatory system in accordance with one or more embodiments of the disclosure.

One such application in which the metal panel 102 can be used as a radio frequency shield is shown in FIG. 12. Turning now to FIG. 12, illustrated therein is a "trunk" 1200 used in cable television and fiber optic applications. The trunk 1200 defines a housing into which one or more electrical circuits 1201,1220 can be disposed. Illustrative electrical circuitry 1201 can include amplifier modules, power supplies operable with the amplifier modules, control boards, and a node/amplifier determination module. For convenience to the end user, in one embodiment the trunk 1200 is a housing module that resembles a vintage luggage trunk having a first portion 1202 and a second portion 1203.

In this illustrative embodiment, the first portion 1202 defines what is known as the "lid" of the trunk 1200, while the second portion 1203 defines what is known as the "base" of the trunk 1200. Note that the lid is disposed above the base. In many applications, this convention will be reversed. Said differently, in many applications the bottom, deeper portion is the lid and the upper, shallower portion is the base. However, for ease of illustration the lid is shown above the base in FIG. 12.

In one embodiment the base and lid are pivotably coupled together by one or more hinges 1204 so that the trunk 1200 can be closed for convenient, and weatherproof, deployment in the field. In one embodiment, the base of the trunk 1200 includes one or more apertures 1205,1206,1207 through which input and/or output cables can be coupled. Similarly, the lid of the trunk 1200 can include one or more apertures 1208,1209,1210 through which cables can be coupled to the internal components of the trunk 1200.

In this illustrative embodiment, the amplifier module is disposed in the base of the trunk 1200. However, the power supply, control board, and node/amplifier determination module are disposed in the lid of the trunk 1200. Those of ordinary skill in the art having the benefit of this disclosure will understand that other configurations may be more suitable for other applications.

As noted above, in many applications the current demand of the amplifier module required to provide the necessary gain is high. Accordingly, the amplifier module can produce large amounts of radio frequency noise. In such an application, the metal panel 102 can be used to shield the power supply, control board, and node/amplifier determination module from the amplifier module. Specifically, using the process shown in FIG. 2 and FIGS. 4-11 above, fasteners 103 in accordance with one or more embodiments of the disclosure can be used to couple the metal panel 102 to one or more threaded bosses (101) coupled to the trunk 1200. In one embodiment, the electrical circuits 1201 define a ground node (1001) to which the trunk 1200 and threaded bosses (101) can be tied. In one embodiment, the ground node (1001) is earth ground. By providing an electrical connection between the threaded bosses (101) and the metal panel 102, the fasteners 103 ensure that the metal panel 102 is grounded at each fastener location 1211,1212,1213,1214, 1215,1216,1217 to provide adequate shielding.

Figure 13:
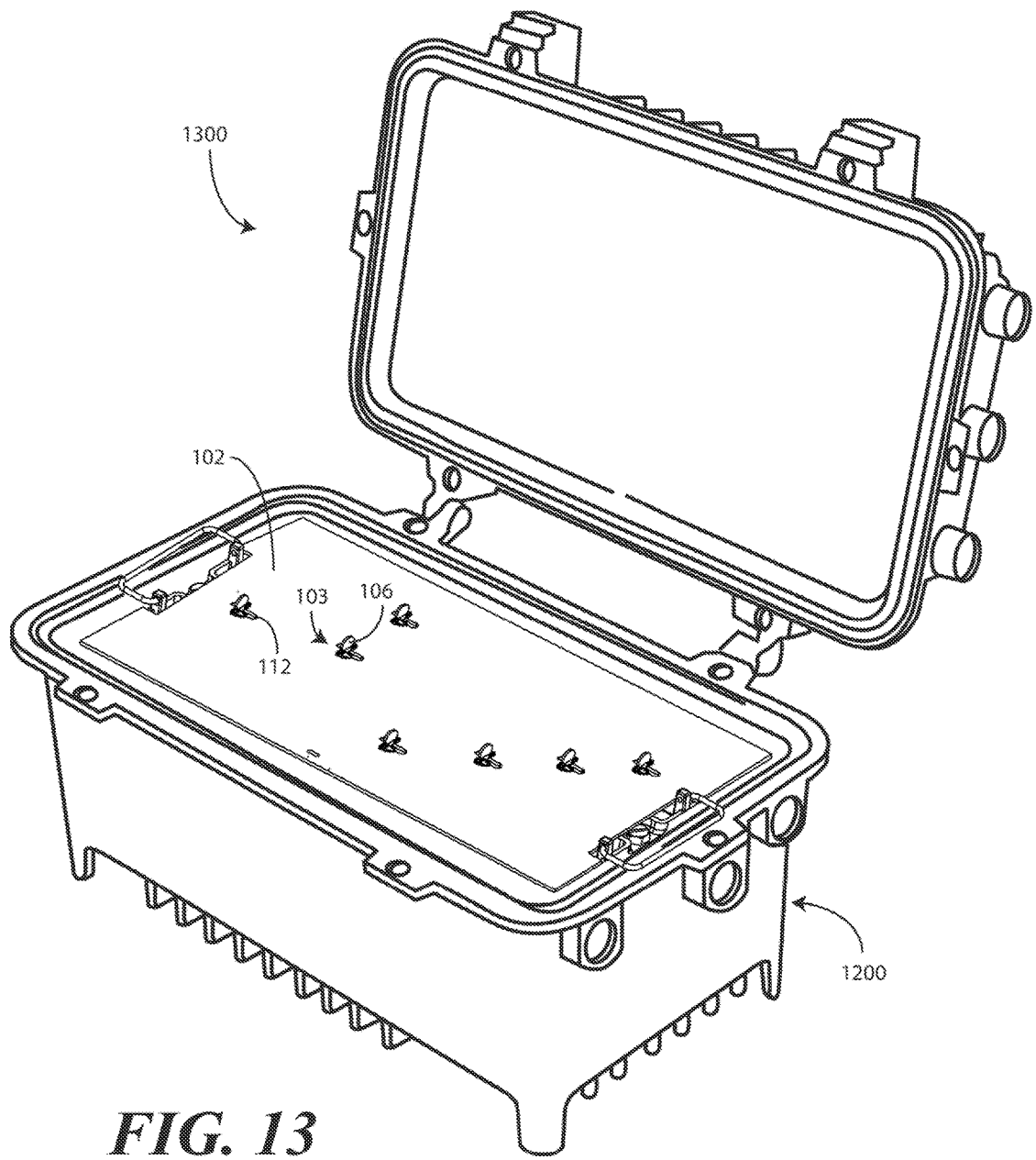
FIG. 13 illustrates a perspective view of one explanatory system in accordance with one or more embodiments of the disclosure.

The shielded assembly 1300 is shown in FIG. 13. The shielded assembly 1300 can be used to transport radio frequency signals such as video, data or telephony. The electrical circuitry (1201) that includes the amplifier module requires a good grounding due to high radio frequency gain demands. The metal panel 102 can be attached to the threaded bosses (101) with fasteners 103 in accordance with one or more embodiments of the disclosure to improve this radio frequency ground. Rather than requiring as many as twelve Phillips head screws to fasten a shield to the trunk 1200 as was the case with prior art solutions, embodiments of the disclosure provide a quarter turn fastener solution that reduces the inconvenience in time and effort associated with inserting and removing prior art screws. As noted above, during the amplifier manufacturing process, the metal panel 102 may be removed several times in when performing electrical and/or radio-frequency (RF) signal alignment and testing. The quick release fasteners 103 make this successive removal and reattachment fast and easy. Additionally, the captive nature of each fastener 103 within each threaded boss 101 ensures that they will not be dropped into the electrical circuitry (1201), thereby causing shorts or otherwise compromising reliability.

As described above, embodiments of the disclosure can utilize the same metal cover for grounding after it has been punched by metal stamping in the locations where the screw normally resides. The punch on the metal creates a progressive protrusion which along with the depicted fastener 103 serves as a quick fastening mechanism. During attachment of the metal panel 102 to the trunk 1200, the metal panel 102 can be placed and the fasteners 103 tightened up to a certain limit within the oblong aperture 112. This will define the torque and the fastening force.

During detachment of the metal panel 102, the fastener 103 does not need to be removed completely. Instead it is merely rotated (115) by a quarter turn to the first rotational alignment (113) where the oblong aperture is aligned with the paddle 106, thereby allowing the paddle to pass through the oblong aperture. The fastener 103 is kept on the trunk 1200, which reduces the occurrence of the fastener 103 falling into the electrical circuitry (1201). Said differently, the fastener 103 is captive on the trunk 1200. Embodiments of the disclosure can be implemented in all cable television amplifiers and nodes which require a metal panel 102 for adequate grounding.

In one embodiment, the metal panel 102 can be modified with a progressive protrusion at the fastener locations (1211, 1212,1213,1214,1215,1216,1217). These protrusions can be made with metal stamping process. Normal screws are replaced with fasteners 103 configured in accordance with one or more embodiments of the disclosure. With each fastener turn, a technician defines the torque on the metal panel 102 against the trunk 1200. Removal of the metal panel 102 is accomplished by unscrewing the fastener 103 a quarter turn, up to the point where the paddle 106 passes trough the oblong aperture 112.

The use of embodiments of the disclosure provides several advantages over prior art solutions using screws. For example, embodiments of the disclosure facilitate captive fasteners to avoid occurrences of the fastener 103 falling into the electronic circuitry (1201). This can occur frequently when the trunk 1200 is coupled to a pole and is opened.

Additionally, the use of embodiments of the disclosure simply save time. In prior art solutions, twelve screws have to be tightened. This represents a manufacturing process of forty-three seconds with pneumatic tools, or alternatively several minutes if done manually. Using embodiments of the present disclosure, the time required to remove the metal panel 102 can be minimized. It is noted that quick removal of the metal panel 102 can solve issues in manufacturing processes where a "fast cover" is used during RF alignment and then replaced with the metal panel 102.

Figure 14:
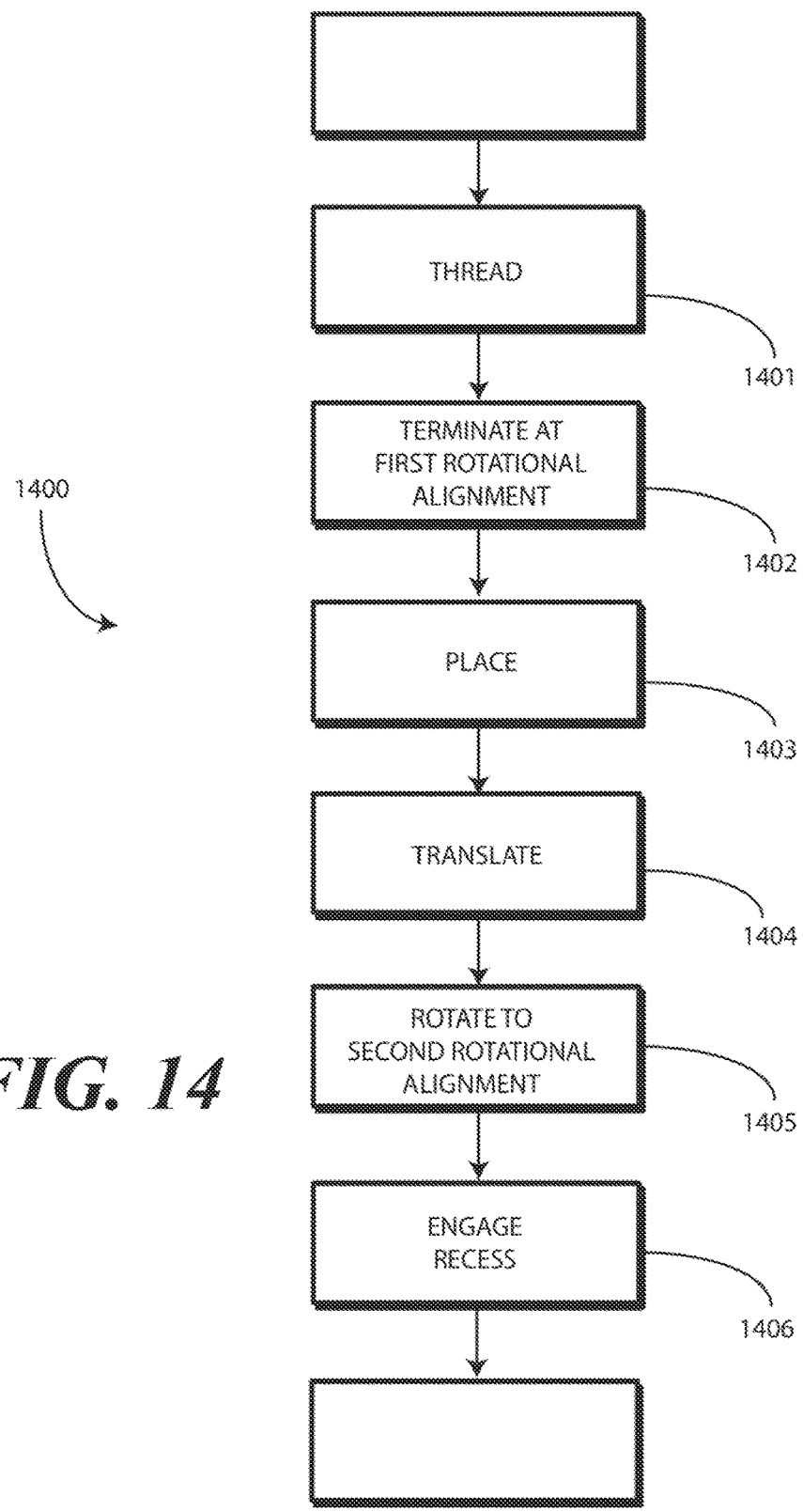
FIG. 14 illustrates one explanatory method in accordance with one or more embodiments of the disclosure.

While one or more methods of using embodiments of the disclosure have been described in detail above with reference to FIG. 3 and FIGS. 4-11, FIG. 14 illustrates a summary of one explanatory method 1400 in flowchart form. Turning now to FIG. 14, at step 1401 the method 1400 includes threading a fastener into a threaded boss having a central axis. It should be noted that step 1401 only occurs once, i.e., the first time the fasteners are installed into the boss. Thereafter, step 1401 is omitted, as a mere quarter turn is all that is needed to remove or attach a metal panel. Advantageously, the slow and tedious step 1401 of fully threading the fasteners is no longer required after they are initially installed. Quarter turns are all that is required for engagement. At step 1402, the method 1400 includes terminating the threading of step 1401 with a paddle of the fastener oriented in a first rotational alignment about the central axis.

At step 1403, the method 1400 includes placing a metal panel against the threaded boss. It should be noted that this step 1403 can optionally be performed prior to step 1401. However, when performed after step 1402, step 1403 occurs by passing the paddle through an aperture in the metal panel. Where step 1403 is performed after step 1402, the method 1400 can also include optional step 1404 in which the metal panel is translated along a plane that is oriented substantially orthogonally with the central axis of the threaded boss. This translation disposes the paddle adjacent to one or more retention contours disposed along the metal panel so that the bottom surfaces of the paddle can translate along the ramps when the paddle is rotated from a first rotational alignment to a second rotational alignment.

At step 1405, the method 1400 includes rotating the paddle to the second rotational alignment about the central axis. In one embodiment, this step 1405 results in the paddle translating along a curved ramp. In one embodiment, this step 1405 concludes when the paddle engages a retention bridge disposed at an end of the curved ramp at step 1406. The method 1400 can be performed in reverse, i.e., beginning at step 1406, to remove the metal panel from the threaded boss.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A system, comprising:
a metal panel; and
a plurality of fasteners for fastening the metal panel in a plurality of positions to at least one of a radio frequency (RF) amplifier or an RF amplifier housing to provide electrical grounding, the plurality of fasteners each terminating at an oblong paddle and comprising a threaded shaft for receipt by a threaded boss;
the metal panel defining a plurality of oblong aperture, each having a major dimension defined along a first axis and a minor dimension defined along a second axis, the oblong paddles configured to pass through each of the plurality of oblong apertures when the respective oblong paddle is rotated to a first rotational alignment about the oblong paddle's central axis; and
the metal panel comprising one or more retention contours disposed adjacent to each of the plurality of oblong apertures, each retention contour comprising a ramp defined by a curved central axis and a retention bridge defining a recess to receive the respective oblong paddle when rotated to a second rotational alignment about the oblong paddle's central axis,
wherein when rotated to the second rotational alignment, the bottom edges of the oblong paddle translate up each ramp until seated in each retention contour of each retention bridge, wherein the second rotational alignment is within a half-turn of the first rotational alignment.

2. The system of claim 1, the first rotational alignment oriented substantially orthogonally with the second rotational alignment.

3. The system of claim 1, the curved central axis defined by a radius having a focus disposed within a perimeter of the oblong aperture.

4. The system of claim 1, each recess defining a median axis, the median axis oriented substantially parallel with the second axis.

5. The system of claim 1, the recess defining a rounded, concave contour.

6. The system of claim 1, each ramp commencing at a ramp lip oriented substantially parallel with the first axis.

7. The system of claim 6, wherein a first ramp lip is collinear with the first axis.

8. The system of claim 7, wherein the second axis bisects a second ramp lip.

9. The system of claim 1, the oblong aperture defined by a first semicircle separated from a second semicircle by a first extended edge and a second extended edge.

10. The system of claim 9, the one or more retention contours comprising a first retention contour comprising a first ramp commencing at a first ramp lip disposed adjacent to the first semicircle and a second retention contour comprising a second ramp commencing at a second ramp lip disposed adjacent to the first extended edge.

11. The system of claim 1, each retention contour comprising a stamped metal contour.

12. The system of claim 1, further comprising:
a housing coupled to the threaded boss; and
one or more electrical circuits disposed within the housing, the one or more electrical circuits defining a ground node;
the fastener to couple the metal panel to the threaded boss to electrically connect the metal panel to the ground node.

13. The system of claim 1, the metal panel defining a radio frequency shield.

14. The system of claim 1, the oblong paddle defining one or more ovular major faces.

15. The system of claim 1, the metal panel to deflect when the oblong paddle is rotated from the first rotational alignment to the second rotational alignment.

16. A system, comprising:
a threaded boss defining a central axis;
a metal panel; and
a fastener for fastening the metal panel in a plurality of positions to at least one of a radio frequency (RF) amplifier or an RF amplifier housing to provide electrical grounding, the plurality of fasteners each comprising a threaded shaft terminating at a paddle, for each fastener to rotationally insert into the threaded boss along the central axis to couple the metal panel to the threaded boss;
the metal panel:
defining a plurality of aperture, each having a major dimension defined along a first axis and a minor dimension defined along a second axis to allow each paddle to pass through each of the apertures when a respective paddle is rotated to a first rotational alignment about the central axis; and comprising a first retention contour and a second retention contour, each retention contour:

disposed adjacent to each of the plurality of apertures;

comprising a ramp defined by a curved central axis and a retention bridge defining a recess to retain the respective paddle in a second rotational alignment about the central axis, wherein when rotated to the second rotational alignment, the bottom edges of the oblong paddle translate up each ramp until seated in each retention contour of each retention bridge, wherein the second rotational alignment is within a half-turn of the first rotational alignment.

17. The system of claim 16, the first retention contour comprising a first ramp defined by a first radius originating at a first focus, the second retention contour comprising a second ramp defined by a second radius originating at a second focus offset along the first axis from the first focus.

18. The system of claim 16, the curved central axis defined by radius having an arc of forty-five degrees.

19. A method of shielding an electronic circuit, comprising:

threading a fastener into a threaded boss having a central axis for fastening the metal panel in a plurality of positions to at least one of a radio frequency (RF) amplifier or an RF amplifier housing to provide electrical grounding;

terminating the threading with a paddle of the fastener oriented in a first rotational alignment about the central axis;

placing a metal panel against the threaded boss by passing the paddle through an aperture in the metal panel; and rotating the paddle to a second rotational alignment about the central axis to:

translate the paddle along a curved ramp; and engage the paddle with a retention bridge disposed at an end of the curved ramp, wherein when rotated to the second rotational alignment, the bottom edges of the oblong paddle translate up each ramp until seated in each retention contour of each retention bridge, wherein the second rotational alignment is within a half-turn of the first rotational alignment.

20. The method of claim 19, further comprising translating the metal panel along a plane oriented substantially orthogonally with the central axis.

* * * * *